United States Patent [19]

DuRocher

[11] 4,067,945

[45] Jan. 10, 1978

[54] METHOD OF MAKING A MULTI-CIRCUIT ELECTRICAL INTERCONNECTOR

[75] Inventor: Gideon A. DuRocher, Mount Clemens, Mich.

[73] Assignee: Essex International, Inc., Fort Wayne, Ind.

[21] Appl. No.: 669,998

[22] Filed: Mar. 24, 1976

[51] Int. Cl.² ............................................. H01H 3/00
[52] U.S. Cl. ..................................... 264/104; 29/625; 29/628; 264/126; 264/156; 264/273; 264/294; 264/340; 338/114; 361/422
[58] Field of Search ............... 264/104, 105, 108, 125, 264/126, 156, 259, 261, 272, 273, 294, 340; 29/625, 628; 338/114; 317/101 CC

[56] References Cited

U.S. PATENT DOCUMENTS

| Re. 28,595 | 10/1975 | DuRocher | 338/114 |
| 1,276,411 | 8/1918 | Price | 264/326 |
| 2,714,746 | 8/1955 | Meyer | 264/294 |
| 3,557,446 | 1/1971 | Charschan | 29/625 |
| 3,648,002 | 3/1972 | DuRocher | 338/114 |
| 3,818,279 | 6/1974 | Seeger, Jr. et al. | 29/625 |
| 3,861,135 | 1/1975 | Seeger et al. | 317/101 CC |

*Primary Examiner*—Jeffery R. Thurlow
*Attorney, Agent, or Firm*—Learman & McCulloch

[57] ABSTRACT

A method of making a multi-circuit electrical interconnector comprises the molding of an elastomeric, non-conductive frame member having a number of openings extending therethrough corresponding to the number of circuits that are to be interconnected. Each of the openings is overfilled with a module of uncured, heat curable elastomeric resin containing a plurality of electrically conductive particles. All of the modules are subjected to compression and the modules are cured while maintaining them under compression. All of the cured modules are exercised and stabilized physically and electrically by subjecting them to successive applications of compressive force.

24 Claims, 15 Drawing Figures

METHOD OF MAKING A MULTI-CIRCUIT ELECTRICAL INTERCONNECTOR

The invention disclosed herein relates to a method of making a multi-circuit electrical interconnector that is adapted to form an interface between multiple sets of conductors of the kind commonly supported in separable connector halves. Connectors typical of those with which an interconnector according to the invention are adapted for use are disclosed in Reissue Pat. No. 28,595.

An interconnector of the kind to which the invention relates is particularly adapted to provide a large number of electrically conductive current paths through a non-conductive supporting frame member of small area. Such an interconnector is used as an interface between confronting terminals supported by a pair of mating connector halves. Each connector half normally supports a plurality of closely spaced terminals and it is rare that the ends of all of the terminals of either connector half will occupy the same plane. On the contrary, it is more than likely that some of the terminals will extend several thousandths inch beyond others. Nevertheless, if reliable electrical continuity is to be established between confronting terminals of the connectors, the current paths through the interconnector must be properly aligned with the terminals and must be capable of compensating for differences in spacing between some of the terminals without appreciable differences in voltage drops.

In such interconnectors electrical integrity of each current path also is essential. Such integrity may be insured by isolating each current path from all other current paths by means of the non-conductive material from which the supporting frame is formed. The supporting frame, therefore, must be manufactured to rigid specifications and each of the electrically conductive current paths must be manufactured to similar specifications not only for the purpose of insuring electrical isolation of each current path, but also to assure continuity via the interconnector between each pair of conductors supported by the connectors.

Notwithstanding the rigidity of the specifications to which an interconnector must be produced, the interconnector must be capable of manufacture in mass production quantities and at a low cost by relatively unskilled labor.

An interconnector constructed according to the invention comprises a molded, resilient, non-conductive frame member having a plurality of closely spaced openings therethrough, each of the openings containing an elastomeric module throughout which is dispersed a large quantity of electrically conductive particles. In the curing of the modules they are subjected to compression so as to render them in their cured state normally conductive. The resin from which the modules are formed preferably is heat curable at a temperature which causes the modules to become bonded to the walls of the openings in which they are accommodated. The cured modules may be flush with the opposite sides of the frame or they may project beyond one or both sides of the frame. Prior to utilization of an interconnector formed according to the invention, each of the electrically conductive modules is exercised and stabilized by subjecting it to successive applications of compressive force.

Preferred methods of manufacturing interconnectors according to the invention are described in the following specification and apparatus which may be used in practicing the method is disclosed in the accompanying drawings, wherein.

Figure 1:
FIG. 1 is a flow chart illustrating the principal steps of the method.
Figure 2:
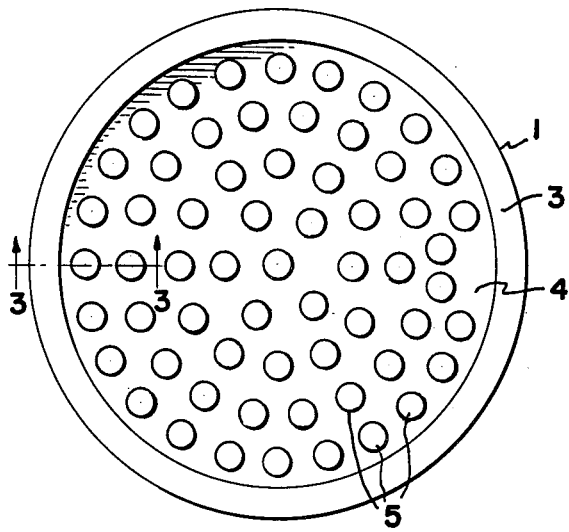
FIG. 2 is a plan view of a mold member for forming a multi-cavity frame.
Figure 3:
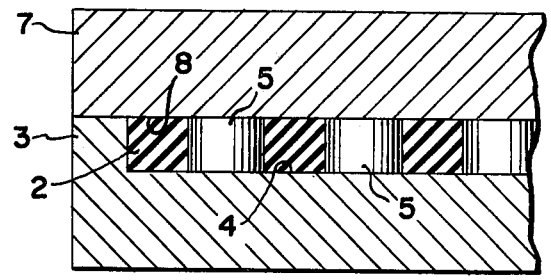
FIG. 3 is an enlarged sectional view taken on the line 3—3 of FIG. 2 and illustrating the molding of a multi-cavity frame.
Figure 4:
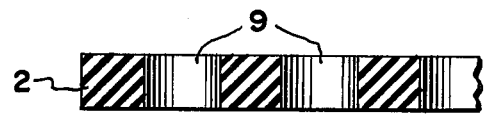
FIG. 4 is a sectional view illustrating a portion of a frame formed in the mold of FIG. 3.

FIG. 2 discloses a mold base 1 for use in molding a non-conductive, elastomeric frame 2 of circular configuration having a large number of cavities or openings extendng therethrough. The mold base 1 is a disc having an upstanding, peripheral flange 3 which defines a chamber having a flat bottom 4 interrupted by a plurality of upstanding pins 5 of uniform height. The diameter of the cavity and the number of pins may vary according to the size of the interconnector to be produced and the number of current paths to be provided through the interconnector.

As will be explained hereinafter, the size of a finished interconnector is influenced by physical characteristics of the materials from which it is formed and the manipulative actions to which it is subjected in manufacture. For illustrative purposes, it will be assumed that the interconnector to be produced from the mold 1 will have a diameter of 1.225 inches, a thickness of 0.030 inch, and a total of 61 current paths therethrough. In the disclosed mold 1, the diameter of the cavity is 1.250 inches, the depth of the cavity is 0.032 inch, and there are 61 pins 5, each of which is 0.032 inch in height and has a diameter of 0.075 inch.

Various kinds of materials may be used in the production of frame 2. It is preferred however, to use a heat curable silicone resin containing an appropriate catalyst so as to form a frame which is elastomeric and has high dielectric strength. One suitable silicone resin is that manufactured by General Electric Company, Schenectady, New York, and designated by the number 458. A suitable catalyst is that designated VAROX and manufactured by R. T. Vanderbilt Company, New York, N.Y.

To produce the frame 2, the cavity of the mold base 1 is filled completely with the resin and catalyst following which a mold cover 7 having a smooth face 8 is clamped by suitable means (not shown) in overlying relation with the base. The assembly then is placed in a curing oven wherein the resin is subjected to its curing temperature of about 400° F. for a period of about five minutes. Following the curing of the resin, the mold is removed from the oven and the frame 2 is removed from the mold. The frame thus formed is a flat, disc-like member having a plurality of uniform, spaced apart cavities or openings 9 extending completely therethrough. If desired or necessary, the frame may be deflashed by means of a deflashing fixture (not shown) similar to the mold base 1.

Although the frame 2 is cured following its being heated to the curing temperature, some residual volatile material contained in the resin or catalyst may still remain in the frame. To provide rigid control over the size of the frame and the size of the cavities 9, it is desirable to volatize completely all of the volatile contents of the frame. This may be accomplished by a post molding curing stage wherein the frame is subjected to heat for a period of time. For example, a frame composed of GE 458 silicone resin and VAROX catalyst may have all of its volatile constituents volatized by being subjected to a temperature of about 400° F. for about eight hours.

All silicone resins shrink somewhat during the molding process. Manufacturers of silicone resins specify the shrinkage factor. By applying the shrinkage factor specified by the resin manufacturer, it is possible to construct the cavity of the mold 1 sufficiently larger in diameter and thickness to compensate for the shrinkage and produce a cured frame 2 having a predetermined diameter and thickness. The diameter of the frame 2 is critical to proper functioning of a multi-circuit interconnector inasmuch as the conductive paths through the interconnector must be in alignment with the terminals to be interconnected. The diameter also is critical if the interconnector is to be accommodated within a closely fitting housing. Further considerations in producing a predetermined diameter frame 2 will be discussed hereinafter.

Figure 5:
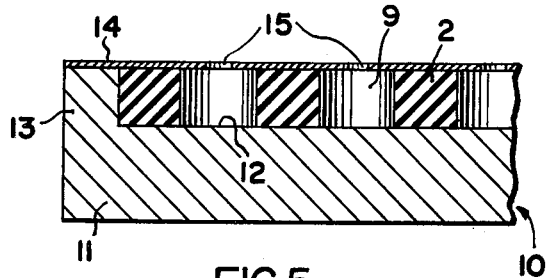
FIG. 5 is a sectional view illustrating the frame of FIG. 4 in a fixture preparatory to filling the cavities of the frame with elastomeric, conductive modules.
Figure 6:
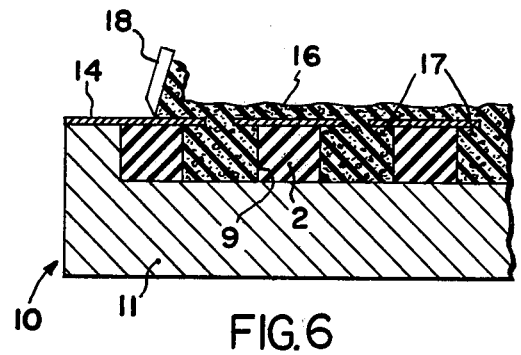
FIG. 6 is a view similar to FIG. 5, but illustrating the cavity filling procedure.
Figure 7:
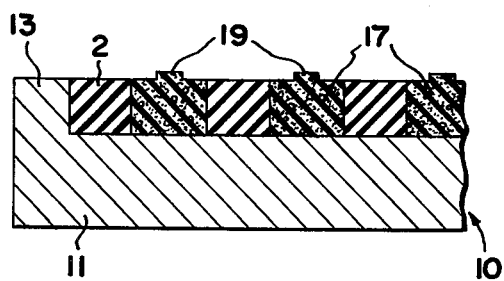
FIG. 7 is a view similar to FIG. 6 and illustrating the filled cavities.
Figure 8:
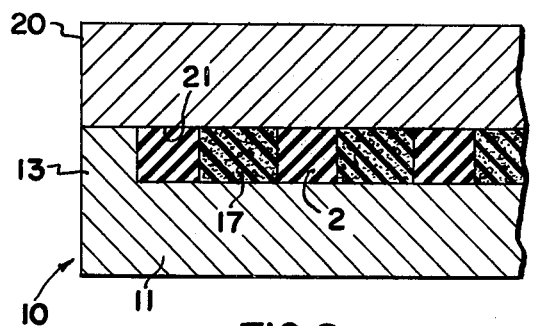
FIG. 8 is a view similar to FIG. 7, but illustrating a fixture used in the curing of the elastomeric modules.
Figure 9:
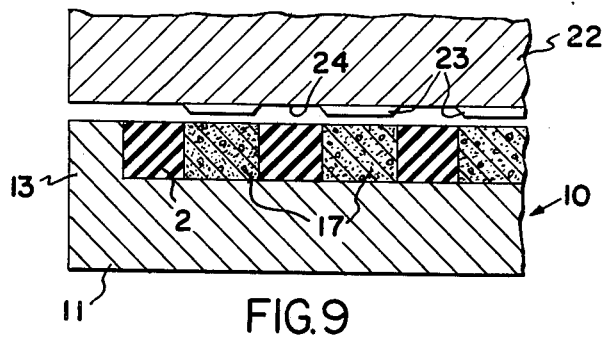
FIG. 9 is a view similar to FIG. 8, but illustrating a fixture used in exercising the cured modules.

Following the post molding curing of the illustrative frame 2, its diameter is reduced, by shrinkage, to 1.210 inches and its thickness is reduced to 0.030 inch. The frame is fitted into a fixture 10 comprising a preferably metal body 11 having a flat bottom cavity 12 therein encircled by a peripheral wall 13. The diameter of the cavity 12 corresponds to the reduced diameter of the frame 2 and the depth of the cavity corresponds to the thickness of the frame. Over the cavity 12 is placed a screen comprising a thin, preferably stainless steel disc 14 having a thickness of about 0.004 inch and having a plurality of spaced apart openings 15 therein corresponding in number and spacing to the cavities 9 in the frame 2. In the fixture of FIG. 5, the diameter of each opening 15 is uniform, but it is less by 0.010 inch than that of the cavity 9 in the frame 2. The disc 14 is secured in any suitable means (not shown) in a position in which the openings 15 overlie and communicate with the cavities 9.

After the disc 14 is secured to the fixture 10, a mixture 16 of uncured silicone resin and catalyst, throughout which is dispersed a large quantity of electrically conductive particles is applied to the upper surface of the disc 14. The particles preferably comprise copper spheres coated with a low resistance noble metal such as silver. The particles thus will have a low electrical resistance corresponding to that of the coating metal. The quantity of particles included in the mixture 16 is between about 80 and 95 volume percent, and the size of such particles preferably is between 3 and 8 mils. The size of the particles will vary directly according to the value of the current to be conducted by them.

the mixture 16 is forced into the cavities 9 of the frame through the openings 15 in the disc 14 by a roller or squeegee (not shown) so as to fill completely and uniformly each of the cavities 9 with a module 17 of the mixture. The excess of the mixture 16 then may be scraped off the disc 14 by means of a blade 18 to enable the disc's being used repeatedly. The disc 14 then may be removed from the fixture 10 whereupon each module 17 will have a cylindrical projection 19 which extends beyond the upper surface of the frame 2 a distance corresponding to the thickness of the disc 14. Each module 17 will be flush with the lower surface of the frame 2 inasmuch as the bottom of the cavity 12 is flat.

Following removal of the disc 14 a cover 20 having a smooth bottom surface 21 may be placed in overlying relation with the fixture 10 and clamped against the latter by suitable means (not shown). The projections 19 will be forced into the cavities 9, thereby overfilling the cavities and subjecting the modules 17 to a compressive force. The length and diameter of each projection 19 should be so selected with reference to the metal particle content of each module 17 that the compression of the modules causes a sufficient number of particles to engage one another to render each of the modules 17 electrically conductive. The compression of the modules 17 also will cause them to exert lateral forces on the frame 2 tending to expand the latter radially. The wall 13, however, prevents such expension of the frame.

While maintaining the modules 17 under compression, the fixture 10 is transferred to an oven wherein the modules are cured at the prescribed curing temperature for the prescribed time. If the resin and catalyst of the modules 17 are the same as those referred to earlier, the curing time and temperature also will be the same.

During the curing of the modules 17, there will be some shrinkage of the modules. The size of each projection 19 thus should be so selected as to ensure that the associated module 17 remains under compressive force notwithstanding the shrinkage. The size of the projection 19 necessary to ensure this relationship will vary according to the volume of each cavity 9. Thus, the combined volume of the module 17 and the projection 19 can be determined empirically for any size cavity 9.

During the curing of the modules 17 it is preferred that the modules be bonded to the wall of the associated cavities 9, thereby permitting a finished interconnector to be handled or rolled without loss of the modules. Bonding may be achieved by utilizing a bonding catalyst such as that referred to earlier or by utilizing a silicone resin of the same family as that from which the frame 2 is formed. Silicone resins of the same family have an affinity for one another and such affinity is enhanced by the curing of the modules under compressive force.

Following curing of the modules 17, the cover 20 is removed from the fixture 10 and is replaced by a cover 22 which has a number of short posts 23 projecting beyond its otherwise smooth undersurface 24. The number and spacing of the posts 23 correspond to the number and spacing of the modules 17. The cover 22 is vertically reciprocable by means (not shown) toward and away from the fixture 10 so as to enable the posts 23 to engage and exercise the modules by exerting successive applications of compressive force on them. The stroke length of the posts 23 following their engagement with the modules 17 in the illustrative embodiment is 0.005 inch or about one-sixth the length of the modules. The modules are exercised six to ten times each for the purpose of stabilizing them physically and electrically.

Physical stabilization of the modules requires dissipation of physical hysteresis of the modules resulting from their molding process. By physical hysteresis is meant the changing resistance of a module to successive application of compressive force of uniform value and stroke length. After a module has been compressed and released a number of times its resistance to compressive deformation becomes substantially a constant and its physical hysteresis is dissipated.

The exercising of the modules also results in their electrical stabilization. For example, until such time as the physical hysteresis of a module is dissipated, the voltage drop across the module also exhibits hysteresis having a curve similar to the physical hysteresis curve. During the exercising of a module to dissipate physical hysteresis, the electrical resistance of the module exhibits decreasing hysteresis characteristics, but the electrical hysteresis also is substantially eliminiated by the time the physical hysteresis is dissipated.

Exercising of the modules causes them to expand, thereby exerting additional radial expansive force on the frame 2. Expansion is prevented, however, by the wall 13 of the fixture 10.

Figure 15:
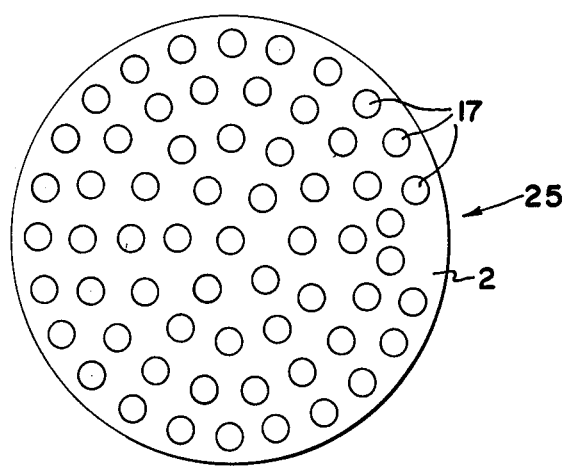
FIG. 15 is a plan view of a finished, typical interconnector.

Following exercising of the modules 17, the finished interconnector 25 (FIG. 15) comprising the frame 2 and the modules 17 may be stripped from the fixture 10. Removal of the interconnector from the fixture 10 will enable the frame 2 to expand radially so that its overall diameter is somewhat greater than the diameter of the cavity 12. By careful control of the diameters of the cavities 4 and 12, the thickness of the frame, the diameter of the cavities 9, and the quantity of the mixture 16 introduced to the cavities, the diameter of the interconnector after its removal from the fixture 10 will correspond exactly to the desired predetermined diameter of the finished interconnector. All of these factors may be determined empirically for each size interconnector desired. The diameter of the illustrative interconnector 25 is 1.225 inches and its thickness is 0.030 inch.

Figure 12:
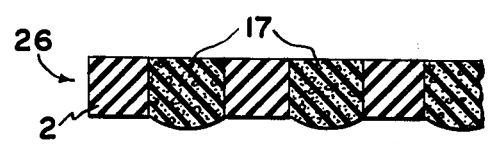
FIG. 12 is a sectional view of a finished interconnector having modules projecting beyond one side of the frame.
Figure 14:
FIG. 14 is a sectional view of a finished interconnector having modules projecting beyond both sides of the frame.

It is not essential that all interconnectors produced according to the invention have modules 17 flush with the opposite sides of the frame 2. On the contrary, an interconnector 26 can be manufactured in which the modules 17 are flush with one surface of the frame and protrude beyond the other surface, as is shown in FIG. 12. Alternatively, as shown in FIG. 14, an interconnector 27 may have modules 17 that protrude beyond both sides of the frame 2.

Figure 10:
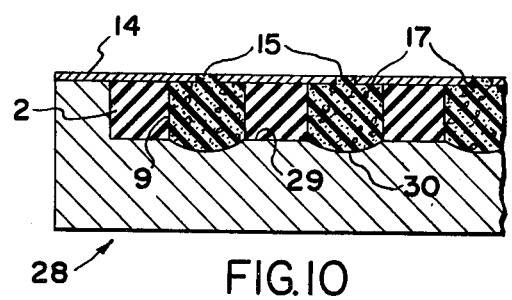
FIG. 10 is a view similar to FIG. 6 illustrating the filling of the cavities of the frame with modules adapted to project beyond one side of the frame.
Figure 11:
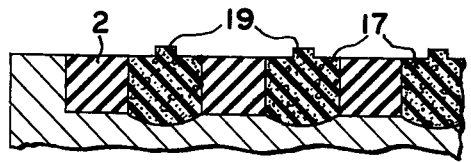
FIG. 11 is a sectional view of a frame having elastomeric modules formed in the fixture of FIG. 10.

Apparatus for producing the interconnector 26 is illustrated in FIGS. 10 and 11 as comprising a fixture 28 which corresponds in all respects to the fixture 10 with the exception that the bottom 29 of the fixture cavity has semi-spherical recesses 30 in alignment with each of the cavities 9. The procedures followed in producing the interconnector 2 are the same as has been described earlier.

Figure 13:
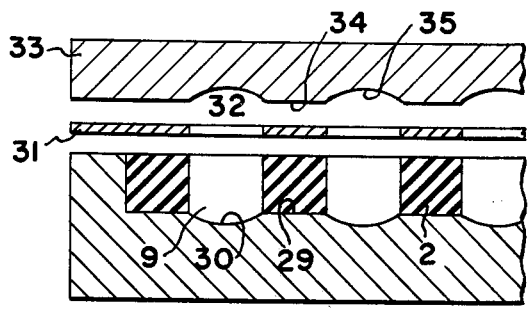
FIG. 13 is a sectional view illustrating a fixture which may be used to provide the frame with modules projecting beyond both sides of the frame.

Apparatus for producing the interconnector 27 is illustrated in FIG. 13 and includes the same fixture 28 shown in FIG. 10. The apparatus also includes a screen disc 31 that corresponds to the screen disc 14 with the exception that the openings 32 through the screen disc 31 corrrespond in diameter to the diameter of the frame cavities 9. The apparatus of FIG. 13 also includes a cover 33, the lower surface 34 of which is flat except for semi-spherical recesses 35 aligned with the frame cavities 9.

In the use of the apparatus of FIG. 13, the cavities 9 are filled with the mixture 16, using the screen disc 31. Removal of the screen disc will result in the mixture's projecting above the level of the frame 2. When the cover 33 is clamped atop the fixture 28, the semi-spherical recesses 35 will cause a force to be exerted on the material filling each cavity 9 so as to subject the material to compressive force. The procedural steps hereinbefore described then may be followed to produce the interconnector 27.

The methods disclosed herein represent presently preferred methods, but are intended to be illustrative rather than definitive of the invention. The invention is defined in the claims.

I claim:

1. A method of forming at least one electrically conductive path through a non-conductive member having at least one cavity therein, said method comprising filling said cavity with a mixture of uncured elastomeric resin and a plurality of electrically conductive particles; curing said resin to produce an elastomeric module; and exercising said module following curing thereof to dissipate substantially its physical hysteresis by successively applying and releasing compressive force repeatedly to and from said module.

2. The method according to claim 1 including subjecting said mixture to compressive force during the curing of said resin.

3. The method according to claim 1 wherein said mixture has a volume greater than that of said opening.

4. The method according to claim 3 wherein said mixture protrudes beyond at least one side of said member and including compressing said mixture prior to curing of said resin to a condition flush with said one side of said member.

5. The method according to claim 3 wherein said mixture protrudes beyond at least one side of said member and including compressing said mixture prior to curing of said resin to a condition in which said module is flush with one side only of said module.

6. The method according to claim 1 wherein said module is flush with opposite sides of said member.

7. The method according to claim 1 wherein said module protrudes beyond at least one side of said member.

8. The method according to claim 1 wherein said module protrudes beyond opposite sides of said member.

9. The method according to claim 1 wherein said member has a plurality of spaced apart cavities therein, filling each of said cavities with said mixture, curing the resin in all of said cavities simultaneously to produce a plurality of said modules, and exercising all of said modules simultaneously.

10. A method of making an electrical connector comprising molding and curing a heat curable elastomeric resin to form a flat, electrically non-conductive member having at least one cavity therein; introducing to said cavity a mixture of uncured, non-conductive, elastomeric resin and a quantity of electrically conductive particles, said mixture having a volume greater than that of said cavity; compressing said mixture; curing said resin while maintaining said mixture under compression to form an elastomeric, electrically conductive module supported by said member, and substantially dissipating physical hysteresis of said module by successively applying and releasing compressive force repeatedly to and from said module following curing of the latter.

11. The method according to claim 10 including bonding said module to said member.

12. The method according to claim 11 wherein the bonding of said module to said member is effected by heating said resin and said member to a temperature at which they adhere to one another.

13. The method according to claim 10 including heating said member following curing thereof to an elevated temperature for a length of time sufficient to volatize its volatile constituents.

14. The method according to claim 1 including bonding said module to said member.

15. The method according to claim 10 wherein said module protrudes beyond one side only of said member.

16. The method according to claim 10 wherein said module protrudes beyond opposite sides of said member.

17. The method according to claim 10 wherein said module is flush with opposite sides of said member.

18. The method according to claim 10 wherein said mixture is compressed to an extent sufficient to expand said member transversely of said cavity to a predetermined dimension.

19. The method according to claim 14 wherein the bonding of said module to said member is effected by heating said resin and said member to a temperature at which they adhere to one another.

20. The method according to claim 1 wherein the exercising of said module is effected while said module occupies said cavity.

21. The method according to claim 10 wherein the exercising of said module is effected while said module occupies said cavity.

22. In a method of making an electrical connector of the kind comprising a non-conductive body having at least one cavity occupied by an electrically conductive, cured, elastomeric module, the improvement comprising substantially dissipating physical hysteresis of said cured module by successively applying and releasing compressive force to and from said module a plurality of times.

23. The method according to claim 22 wherein the application and release of said force is effected while said module occupies said cavity.

24. The method according to claim 22 wherein said body has a plurality of cavities each of which is occupied by one of said modules, and wherein all of said modules are compressed and released simultaneously while occupying said cavities.

* * * * *